(12) United States Patent
Rudolph et al.

(10) Patent No.: US 8,057,855 B1
(45) Date of Patent: *Nov. 15, 2011

(54) NON-PRESSURE GRADIENT SINGLE CYCLE CVI/CVD APPARATUS AND METHOD

(75) Inventors: James W. Rudolph, Colorado Springs, CO (US); Vincent R. Fry, Santa Fe Springs, CA (US)

(73) Assignee: Goodrich Corporation, Charlotte, NC (US)

( * ) Notice: Subject to any disclaimer, the term of this patent is extended or adjusted under 35 U.S.C. 154(b) by 502 days.

This patent is subject to a terminal disclaimer.

(21) Appl. No.: 12/168,592

(22) Filed: Jul. 7, 2008

Related U.S. Application Data

(63) Continuation-in-part of application No. 11/141,499, filed on May 31, 2005, now Pat. No. 7,691,443.

(51) Int. Cl.
*C23C 16/00* (2006.01)
(52) U.S. Cl. .............. 427/249.2; 427/249.1; 427/255.12
(58) Field of Classification Search ................ 427/249.2
See application file for complete search history.

(56) References Cited

U.S. PATENT DOCUMENTS

| | | | |
|---|---|---|---|
| 4,134,360 A | 1/1979 | Fisher et al. | |
| 4,212,906 A | 7/1980 | Fisher et al. | |
| 4,291,794 A | 9/1981 | Bauer | |
| 4,580,524 A | 4/1986 | Lackey, Jr. et al. | |
| 4,790,052 A | 12/1988 | Olry | |
| 4,895,108 A | 1/1990 | Caputo et al. | |
| 5,348,774 A | 9/1994 | Golecki et al. | |
| 5,480,678 A | 1/1996 | Rudolph et al. | |
| 5,853,485 A | 12/1998 | Rudolph et al. | |
| 5,904,957 A | 5/1999 | Christin et al. | |
| 6,001,419 A * | 12/1999 | Leluan et al. | 427/249.2 |
| 6,132,877 A | 10/2000 | Winckler et al. | |
| 6,572,371 B1 | 6/2003 | Sion et al. | |
| 6,669,988 B2 * | 12/2003 | Daws et al. | 427/249.2 |
| 2001/0019752 A1 * | 9/2001 | Purdy et al. | 428/64.1 |
| 2003/0035893 A1 | 2/2003 | Daws et al. | |

(Continued)

FOREIGN PATENT DOCUMENTS

EP 0846787 6/1998

(Continued)

OTHER PUBLICATIONS

W.V. Kotlensky, "Deposition of Pyrolytic Carbon in Porous Solids," 9 Chemistry and Physics of Carbon, p. 173, pp. 190-203, (1973).

(Continued)

*Primary Examiner* — Timothy Meeks
*Assistant Examiner* — Elizabeth Burkhart
(74) *Attorney, Agent, or Firm* — Snell & Wilmer L.L.P.

(57) ABSTRACT

A process for densifying porous structures inside a furnace using non-pressure gradient CVI/CVD includes disposing a number of porous structures in a stack within a furnace. The stack has a center opening region extending through the porous structures and an outer region extending along the outside of the porous structures. Channels provide fluid communication between the center opening region and the outer region. A first portion of a gas composition is introduced to the center opening region. A second portion of the gas composition is introduced to the outer region. The porous structures are densified from an average density of less than 0.60 g/cm$^3$ to an average density of greater than 1.70 g/cm$^3$ in a single cycle of non-pressure gradient CVI/CVD.

21 Claims, 4 Drawing Sheets

U.S. PATENT DOCUMENTS

2005/0178327 A1    8/2005  Rudolph et al.
2006/0263525 A1*  11/2006  Sion et al. .................. 427/249.2

FOREIGN PATENT DOCUMENTS

| EP | 0995815 | 4/2000 |
| EP | 1285976 | 2/2003 |
| JP | 01197748 | 3/1991 |
| WO | 96/15285 | 5/1996 |
| WO | 2004/097065 | 11/2004 |

OTHER PUBLICATIONS

S. Kimura, N. Takase, S. Kasuya and E. Yasuda, "Fracture Behaviour of C Fiber/CVD C Composite," Carbon '80 (German Ceramic Society) (1980).

A.J. Caputo and W.J. Lackey, "Fabrication of Fiber-Reinforced Ceramic Composites by Chemical Vapor Infiltration," prepared by Oak Ridge National Laboratory for the U.S. Department of Energy under Contract No. DE-AD05-840821400 (1984).

W.J. Lackey, "Review, Status, and Future of the Chemical Vapor Infiltration Process for Fabrication of Fiber-Reinforced Ceramic Composites," Ceram. Eng. Sci. Proc. 10(7-8) p. 577, pp. 577-581 (1989).

T.M. Besmann, R.A. Lowden, D.P. Stinton and T.L. Starr, "A Method for Rapid Chemical Vapor Infiltration of Ceramic Composites," Journal de Physique, Colloque C5, (1989).

T.D. Gulden, J.L. Kaae, K.P. Norton, "Forced-Flow Thermal-Gradient Chemical Vapor Infiltration (CVI) of Ceramic Matrix Composites," Proc.—Electrochemical Society (1990), 90-12 (Proc. Int. Conf. Chem. Vap. Deposition, 11th), (1990) pp. 546-552.

T. Huynh, C.V. Burkland, and B. Bustamante, "Densification of a Thick Disk Preform with Silicon Carbid Matrix by a CVI Process," Ceram. Sci. Proc. 12(9-10) pp. 2005-2014, (1991).

Non-Final Office Action dated Jul. 16, 2007 for U.S. Appl. No. 11/141,499.

Final Office Action dated Apr. 8, 2008 for U.S. Appl. No. 11/141,499.

Non-Final Office Action dated Sep. 22, 2008 for U.S. Appl. No. 11/141,499.

Final Office Action dated Jul. 13, 2009 for U.S. Appl. No. 11/141,499.

Non-Final Office Action dated Oct. 5, 2009 for U.S. Appl. No. 11/141,499.

Notice of Allowance dated Jan. 13, 2010 for U.S. Appl. No. 11/141,499.

I. Golecki et al., Rapid densification of porous carbon-carbon composites by thermal-gradient chemical vapor infiltration, American Institute of Physics, Melville, NY, vol. 66, No. 18, May 1, 1995; pp. 2334-2336.

European Publication, Publication No. EP1728889A2, Published Dec. 6, 2006.

European Search Report, Publication No. EP1728889A3, Published Jul. 25, 2007.

European Search Report for European Application No. 10010533.7 dated Nov. 10, 2010.

\* cited by examiner

NON-PRESSURE GRADIENT SINGLE CYCLE CVI/CVD APPARATUS AND METHOD

RELATED APPLICATIONS

The present patent document is a continuation-in-part of application Ser. No. 11/141,499, now U.S. Pat. No. 7,691,443, filed May 31, 2005, the contents of which are hereby incorporated by reference.

FIELD OF THE INVENTION

The present invention relates to the field of chemical vapor infiltration and deposition processes of a binding matrix within a porous structure. More particularly, the invention relates to non-pressure gradient single cycle processes for enhancing infiltration of a reactant-gas into a porous structure, apparatus for carrying out such processes, and the resulting composite products.

BACKGROUND OF THE INVENTION

Chemical vapor infiltration and deposition (CVI/CVD) is a well known process for depositing a binding matrix within a porous structure. The term "chemical vapor deposition" (CVD) generally implies deposition of a surface coating, but the term is also used to refer to infiltration and deposition of a matrix within a porous structure. As used herein, the term CVI/CVD is intended to refer to infiltration and deposition of a matrix within a porous structure. The technique is particularly suitable for fabricating high temperature structural composites by depositing a carbonaceous or ceramic matrix within a carbonaceous or ceramic porous structure resulting in very useful structures such as carbon/carbon aircraft brake disks, and ceramic combustor or turbine components.

Generally, manufacturing carbon parts using a CVI/CVD process involves placing preformed porous structures in a furnace and introducing a high temperature reactant gas to the porous structures. A variety of porous structures and reactant gases may be used, but typically, a fibrous carbon porous structure is used with a reactant gas mixture of natural gas and/or propane gas when carbon/carbon aircraft brake disks are manufactured. As well understood by those in the art, when the hydrocarbon gas mixture flows around and through the porous structures, some of the carbon atoms separate from the hydrocarbon molecules, thereby depositing the carbon atoms within the interior and onto the surface of the porous structures. As a result, the porous structures become more dense over time as more and more of the carbon atoms are deposited onto the structures. This process is sometimes referred to as densification because the open spaces in the porous structures are eventually filled with a carbon matrix until generally solid carbon parts are formed. U.S. Pat. Nos. 5,480,678 and 5,853,485 to Rudolph et al. and U.S. Pat. No. 6,669,988 to Daws et al., also describe in detail additional aspects of CVI/CVD processes.

Densification processes for annular brake disks may be characterized as either conventional isothermal densification processes or pressure gradient densification processes or variants thereof. In conventional isothermal densification, annular brake disks are arranged in stacks with adjacent brake disks stacked on top of each other. A center opening region is thus formed through the center of each stack. Typically, spacers are placed between adjacent brake disks to form open passages between the center opening region and the outer region. Thus, the reactant gas flows randomly around the stack and may flow through the open passages from the center opening region to the outer region or vice versa. As a result, the pressure differential between the inlet and outlet ducts of the furnace is usually relatively low in conventional isothermal processes.

In pressure gradient densification, the open passages between the center opening region and the outer region are sealed to constrict the flow of the reactant gas between the center opening region and the outer region. Therefore, the pressure differential between the inlet and outlet ducts of the furnace is higher than the pressure used in isothermal densification. As a result, the high pressure differential forces the reactant gas to flow through the interior of the porous brake disk structures, thereby increasing the rate of densification compared to isothermal processes. Conventional isothermal and pressure gradient densification processes may also be combined to achieve optimum densification. For example, a pressure gradient densification process may be used in a first densification to decrease densification time, and a conventional isothermal densification process may be used in a second densification to improve densification quality.

One area of concern during densification is the distribution of the reactant gas flow through and around the porous structures. Gas flow distribution can have a significant impact on the quality of the densified carbon parts and also can affect the cost of production. For example, in one method disclosed in U.S. Pat. No. 5,904,957 to Christin et al., stacks of annular preforms are placed in a furnace with spacer elements placed between each of the preforms and between the last preforms in the stacks and the screens at the top end. Thus, leakage passages are formed between adjacent preforms. The gas is then exclusively channeled towards only the interior passage of each annular stack at the bottom end. The top ends of the stacks are closed by solid screens. One disadvantage with this method is that the outer surfaces of the brake disks near the bottom of the stacks may become starved for gas, thereby producing an undesirable densification of the bottom brake disks and nonuniformity in densification between the bottom and top brake disks. Another disadvantage is that the closed top end of the stacks blocks the gas flow out of the top end, thus causing gas stagnation problems.

Another problem that often occurs during densification is soot and thick coatings on surfaces of the brake disks and tar on the furnace equipment. As is known to those in the art, soot usually refers to undesirable accumulations of carbon particles on the furnace equipment, while tar usually refers to undesirable accumulations of large hydrocarbon molecules on the furnace equipment. The large hydrocarbon molecules cause thick coatings on the surfaces of the brake disks. Typically, accumulations of soot and tar form when the reactant gas stagnates for a period of time in an area or comes into contact with cooler furnace surfaces. Stagnation typically occurs in areas where the gas flow is blocked or where the gas flow is moving more slowly than the surrounding gas flow.

Accumulations of soot and tar can cause a number of problems which affect both the quality of the carbon parts and the costs of manufacturing. Seal-coating is one typical problem that can result from soot and tar, although seal-coating can also be caused by other conditions that are described below. Seal-coating can occur when soot and large hydrocarbon molecules deposit excess carbon early in the densification process on surfaces of the porous structure. As the carbon accumulates on the surfaces of the porous structure, the surface pores eventually become blocked, or sealed, thus preventing the flow of reactant gas from further permeating the porous structure. As a result, densification of the interior region around the seal-coated surface prematurely stops, thereby leaving interior porous defects in the finished carbon part.

Maintenance costs also increase due to soot and tar accumulations on the furnace equipment. During the densification process, accumulations of soot and tar often form throughout the furnace equipment. As a result, an extensive manual cleaning process may be periodically required after each production run to remove all the accumulations and prepare the furnace for the next production run. This cleaning job can be very time consuming and can result in significant delays between production runs. The accumulations can also make disassembly of close fitting parts especially difficult since the accumulations tend to bind the parts tightly together. As a result, furnace equipment sometimes becomes damaged during disassembly due to the difficulty of separating the parts. Additionally, the furnace vacuum lines sometimes become constricted by soot and tar. As those in the art are familiar, the vacuum lines are used to generate the desired gas flow through the furnace. However, soot and tar accumulations sometimes build up in these lines and reduce the performance of the vacuum. Therefore, the vacuum lines must be regularly cleaned, which is a time consuming and expensive task.

In order to produce high quality, low cost parts, carbon deposition should be as uniform as possible around and through the porous structures. One way to achieve this desired uniformity is to optimize the residence time of the gas in the furnace. Residence time typically refers to the amount of time required for a gas to travel through the furnace or other designated area. Typically, a low residence time is associated with an unobstructed flow path and is generally preferred.

Gas flow obstructions often cause additional problems during densification. As previously mentioned, seal-coating is a common problem that causes porous defects within the interior region of the completed carbon parts. However, in addition to the causes previously described, seal-coating also can occur due to nonuniform carbon deposition. This typically occurs when a nonuniform gas flow accelerates carbon deposition at the surface of a part, thereby sealing the surface with carbon deposits and blocking gas diffusion into the interior of the carbon structure. Usually this type of seal-coating occurs later in the densification process when the density of the porous structures is higher.

Another problem associated with nonuniform carbon deposition is the formation of undesirable carbon microstructures. Depending on the process conditions in a CVI/CVD process, the deposited matrix can form different types of carbon microstructure, including rough laminar, smooth laminar, dark laminar, and isotropic. Rough laminar microstructure has the highest density and thermal conductivity, and the least amount of closed-off porosity (porosity that is unavailable for further matrix deposition via a CVI/CVD process.) Smooth laminar microstructure has lower density and thermal conductivity, and is harder than rough laminar. Isotropic carbon microstructure has the least desirable properties for use as a friction material. Dark laminar microstructure has properties between smooth laminar and isotropic microstructure. (For further discussion of the types of carbon microstructure, see H. O. Pierson and M. L. Lieberman, CARBON, Volume 13, 1975, pp. 159-166). A rough laminar carbon microstructure of the CVI deposited matrix is preferred because of the desirable friction and thermal characteristics of this microstructure. However, under certain process conditions, smooth laminar, dark laminar, and/or isotropic carbon microstructures may form instead. When making carbon-carbon composite friction materials, e.g. carbon composite brake disks, smooth and dark laminar and isotropic carbon microstructures within the CVI deposited matrix are generally undesirable because brake friction material disk performance is reduced.

Thus, previous processes, both isothermal and rapid densification processes, required multiple densification steps, with the porous structures requiring rearrangement and machining between steps in order to achieve acceptable densification results in the final product. The rearrangement and machining of the porous structure between cycles is costly and time-consuming. Thus, in spite of these advances, a non-pressure gradient CVI/CVD process and an apparatus for implementing that process are desired that quickly and uniformly densifies porous structures while minimizing cost and complexity. Such a non-pressure gradient process would preferably be capable of simultaneously densifying large numbers (as many as hundreds) of individual porous structures in a single step. In particular, a non-pressure gradient process is desired for quickly and economically densifying large numbers of annular fibrous preform structures for aircraft brake disks having desirable physical properties in a single cycle is preferred.

SUMMARY OF INVENTION

The present invention is directed to a process for non-pressure gradient CVI/CVD densifying porous structures in one cycle inside a furnace. A process for densifying porous structures inside a furnace using non-pressure gradient CVI/CVD includes disposing a number of porous structures in a stack within a furnace. The stack has a center opening region extending through the porous structures and an outer region extending along the outside of the porous structures. Channels provide fluid communication between the center opening region and the outer region. A first portion of a gas composition comprising a highly reactive gas is introduced to the center opening region. A second portion of the gas composition is introduced to the outer region. The first portion and the second portion are controlled proportions thereby introducing predetermined portions of the gas composition to both the center opening region and the outer region. The porous structures are densified from an average density of less than 0.60 g/cm$^3$ to an average density of greater than 1.70 g/cm$^3$ in a single cycle of non-pressure gradient CVI/CVD.

The present invention allows non-pressure gradient CVI/CVD densification of porous structures in a single cycle. This has the benefit of an increase in efficiency from the elimination of the numerous non-value added steps, such as production queue times, furnace loading and unloading, and furnace heat-up and cool-down. In-process machining is not needed and thus is reduced in the single cycle process.

The foregoing paragraphs have been provided by way of general introduction, and are not intended to limit the scope of the following claims. The presently preferred embodiments, together with further advantages, will be best understood by reference to the following detailed description taken in conjunction with the accompanying drawings.

DESCRIPTION OF THE PREFERRED EMBODIMENT

Figure 1:
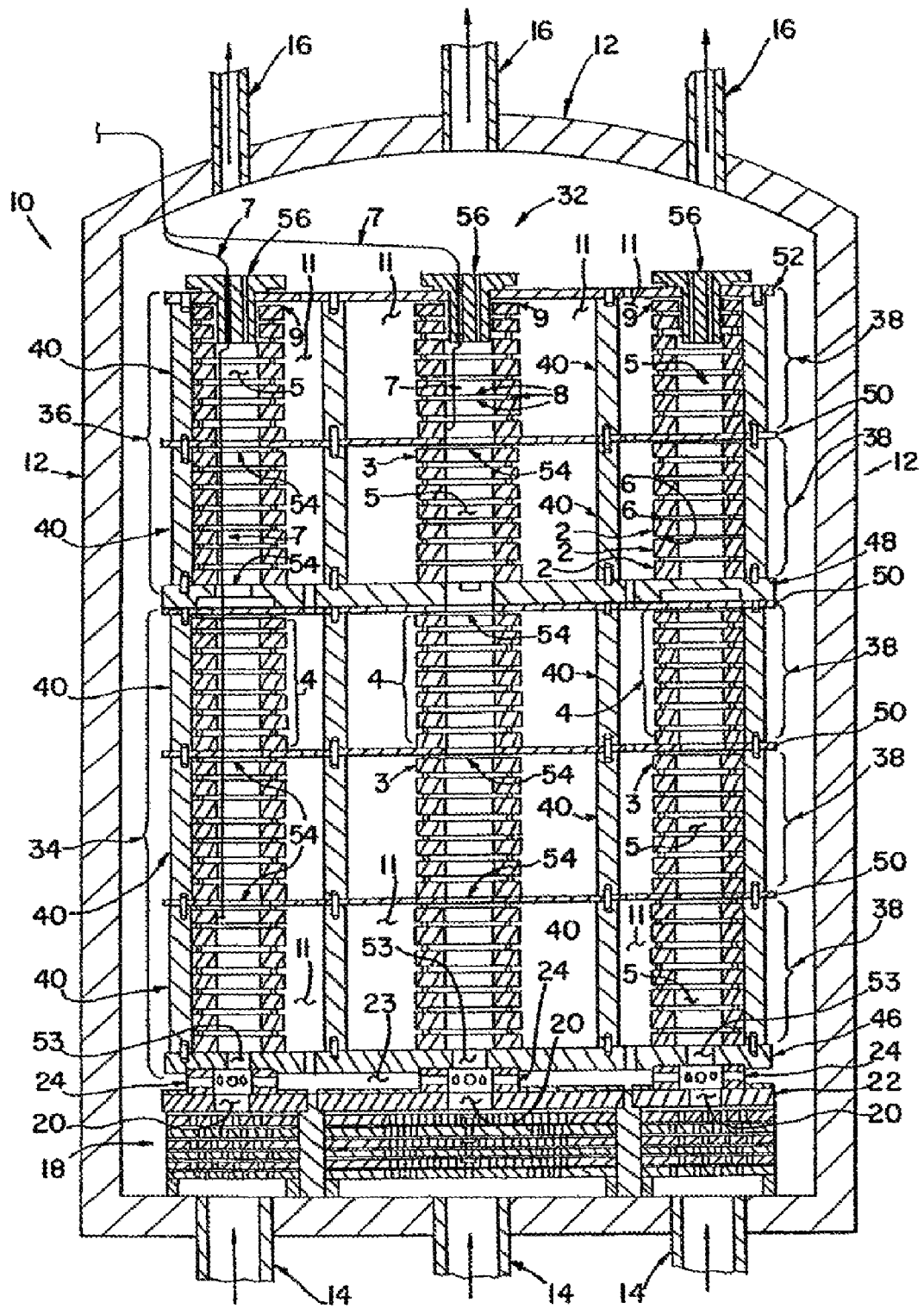
FIG. 1 shows a side cross sectional view of a CVI/CVD furnace.

The invention is described with reference to the drawings in which like elements are referred to by like numerals. The relationship and functioning of the various elements of this invention are better understood by the following description. Each aspect so defined may be combined with any other aspect or aspects unless clearly indicated to the contrary. The embodiments as described below are by way of example only, and the invention is not limited to the embodiments illustrated in the drawings.

The term "single cycle" refers to a process that is capable of densifying porous structures from a starting density to a desired product density in a single non-pressure gradient CVI/CVD process cycle, without the need for either machining or rearranging the porous structures during the process.

Figure 2:
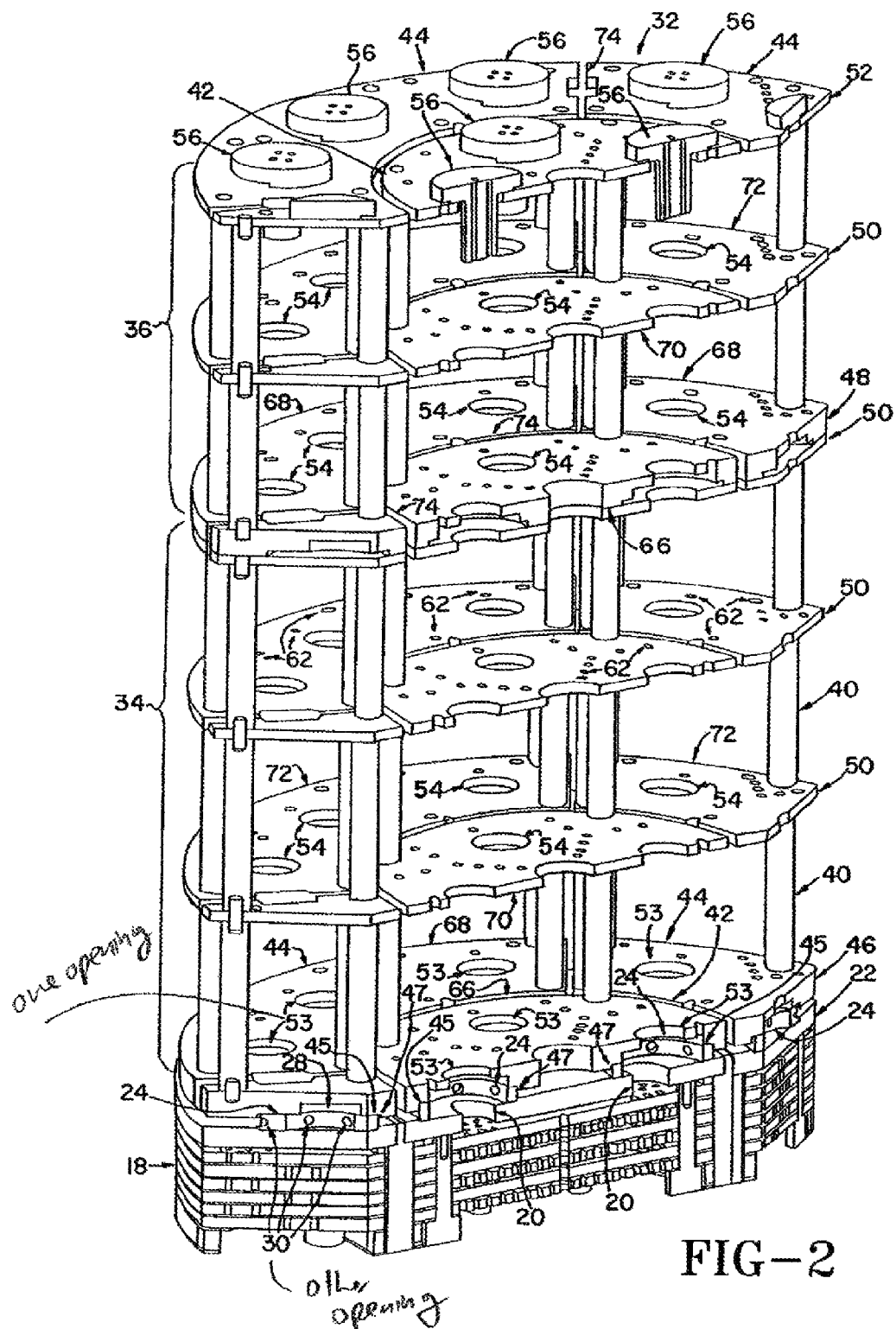
FIG. 2 shows a perspective view of the furnace, showing the top of the furnace open and a portion of the furnace wall broken away to show the hardware assembly.

Referring now to FIGS. 1 and 2, a schematic depiction is presented of a CVI/CVD furnace adapted to deposit a matrix within a porous structure by a non-pressure gradient CVI/CVD process according to an aspect of the invention. A number of different types of furnaces 10 may be used for CVI/CVD processes. Commonly, an induction furnace 10 is used that includes furnace walls 12 that enclose the hardware assembly 32 and the stacks 4 of porous structures 2. A susceptor is disposed around the reactor volume (not shown) and is induction heated by an induction coil according to methods well known in the art. Although induction heating is described herein, other methods of heating may also be used such as resistance heating and microwave heating, any of which are considered to fall within the purview of the invention. The furnace 10 also includes inlet ducts 14 and outlet ducts 16 for introducing and exhausting the gas mixture into and out of the furnace 10.

A preheater 18 is also commonly provided within the furnace 10 to heat the gas before the gas is directed to the porous structures 2. Typically, the preheater 18 is sealed and the incoming gas from the inlet ducts 14 is received by the preheater 18 before being introduced to the hardware assembly 32. The preheated gas is then discharged from the preheater 18 through discharge openings 20 in the furnace floor plate 22 of the preheater 18.

In one embodiment, at least one distributor 24 is provided at the preheater discharge openings 20 for controlling the flow of gas around the stacks 4 of porous structures 2. Preferably, the distributors 24 are removably mounted between the floor plate 22 of the preheater 18 and the base plate 46 of the bottom hardware assembly modules 34. To aid installation of the distributors 24, recessed areas 45 with guide diameters 47 are provided in both the top surface of the floor plate 22 and the bottom surface of the hardware assembly base plate 46. The recessed areas in the floor plate 22 are generally concentric with each of the discharge openings 20, and the recessed areas 45 in the hardware assembly base plate 46 are generally concentric with each of the inlet openings 53. Therefore, the distributors 24 may be easily installed by inserting the outer diameter of each distributor into one of the guide diameters in the floor plate 22, and one of the guide diameters 47 in the base plate 46.

As shown in FIGS. 1 and 2, the distributor 24 directs the gas from the preheater 18 into at least two different portions and directs the portions in different directions. Accordingly, the distributor 24 includes an axial hole 28 that extends longitudinally through the distributor 24. Thus, a first portion of gas flows through the axial hole 28 from the preheater discharge opening 20 to the hardware assembly inlet opening 53, and thence to the 'inside' of the stacks 4. The distributor 24 also includes a number of radial holes 30 that extend out from the axial hole 28 to the outer diameter of the distributor 24. Thus, a second portion of gas flows out of the distributor 24 through the radial holes 30 to the space between the floor plate 22 and the base plate 46, and thus to the 'outside' of the stacks 4. Other equivalent passageways, such as grooves or the like, formed into the floor plate 22, the base plate 46, the distributor 24, or other hardware member may also be used in place of the radial holes 30.

Referencing FIG. 1, in one exemplary embodiment, the first portion that flows through the inlet opening 53 of the base plate 46 (i.e. to the inside of the stacks) represents about 75% to 80% of the gas mixture, and the second portion that flows out through the radial holes 30 (i.e. to the outside of the stacks) represents about 20% to 25% of the gas mixture. In this embodiment, the first gas flow portion is restricted by the inlet opening 53, which is about 5 inches in diameter, in the base plate 46. The second gas flow portion is restricted by the radial holes 30, which may include eight holes about 1 inch in diameter. Other proportions for the first portion and second portion may also be advantageous, and other sizes and placement of the inlet opening 53, axial hole 28 and radial holes 30 may be used. For example, the range of flow through the inlet opening 53 may be as low as 15% to as much as 85%, while the range of flow through the radial holes 30 may be as high as 85% to as low as 15%. Typically, a preferred embodiment uses a proportion of about 15% for the first portion (to the inside of the stacks) and about 85% for the second portion (to the outside of the stacks).

Alternatively, all the gas from the preheater can be directed to the hardware assembly inlet opening 53. The gas can all flow through the preheater discharge opening 20 which can be aligned with the hardware assembly opening 53 so that the gas is exclusively channeled towards only the interior of the stack of porous structures. A distributor or other apparatus can be used in the preheater discharge opening 20 to ensure that the gas is directed to the hardware assembly inlet opening 53 in the desired manner and distributed to both the interior and exterior of the stack. Furthermore, different configurations of equipment are possible wherein the gas is distributed to the interior and exterior of the stack of the porous structures. For example, spacers of varying heights can be used between the base plate 46 and the bottommost porous structures to create the channels.

A hardware assembly is disposed inside the furnace. A typical hardware assembly 32 preferably consists of a number of separate modules 34, 36 to make assembly, disassembly, loading and unloading of the hardware assembly 32 easier. Accordingly, as shown in FIG. 1, the hardware assembly 32 includes a bottom set of modules 34 with three units 38. A unit 38 usually refers to the area between an adjacent base plate 46, 48 and a support plate 50 or between adjacent support plates 50, 52 where one level of porous structure 4 is supported. Support posts 40 separate the base plates 46, 48 and support plates 50, 52, thereby forming each unit 38. The hardware assembly 32 also includes a top set of modules 36 similar to the bottom set 34 with two units 38. As shown in FIG. 2, the top and bottom sets of modules 34, 36 also include a center module 42 with typically four stacks 4 of porous structure 2 and a number of arc-shaped outer modules 44 with two or more stacks 4 of porous structure 2 each, however, different configurations may be used. Accordingly, each of the modules 34, 36, 42, 44 may be loaded into the furnace 10 one at a time, leaving approximately 1 inch gaps 74 between the outer modules 44 and between the outer modules 44 and the center modules 42. Typically, the base plates 46, 48 and support plates 50, 52 are usually referred to as single base plates 46, 48 and single support plates 50, 52 for simplicity even though the base plates 46, 48 include separate center plates 66 and outer plates 68 and the support plates 50, 52 include similar separate center plates 70 and outer plates 72. Preferably, each of the components of the hardware assembly 32 and the distributor 24 are made from a graphite (e.g., HTM or HLM graphite) material that is compatible with typical CVI/CVD processes used for manufacturing carbon/carbon brake disks 2. Alternatively, the components of the hardware assembly 32 and distributor can be made from any material that can withstand the conditions in the furnace. An example of such a material is carbon-carbon material.

The porous structures 2 are loaded into the hardware assembly 32 in stacks 4, with each porous structure 2 being separated from adjacent porous structure 2 with spacers 6 about 0.125 to 1.0 inch thick as shown in FIG. 1. A sufficient quantity of spacers is used to separate the adjacent porous structures and prevent warpage of the structures. Therefore, open passages 8 are formed between adjacent porous structures 2. Similarly, the top porous structure 3, 9 in each unit 38 is spaced about 0.125 to 1.0 inch from the bottom surface of the adjacent support plate 50, 52 to form another open passage 8. Preferably, the spacing between the porous structures is uniform. Further, preferably, the spacing between the porous structures and the bottom and top of support plate 50, as well as top support plate 52 and bottom base plate 46 is uniform. This can be achieved, for example, by placing slotted seal rings between the uppermost porous structure and the adjacent support plate 50. Other arrangements for achieving uniform spacing as well as uniform gas flow can be used and are well within the purview of one of ordinary skill in the art. The stacks 4 of porous structures 2 are also positioned within the hardware assembly 32 with the center openings 5 of the annular porous structures 2 coaxial with the inlet openings 53 in the bottom base plate 46 and with the transfer openings 54 in the support plates 50 and upper base plate 48.

Caps 56 are installed into the transfer openings 54 of the top support plate 52 of the top module 36 in order to restrict gas flow through the top of the stacks 4. Each of the caps 56 include an extended portion that extends down into the center openings 5 of the top porous structure 9. Four longitudinal holes are also provided through the caps 56 to allow some gas flow to escape upward from the center openings 5 of the stacks 4. Thermocouple wires 7 may also be routed through the holes in the caps 56 and down through the center openings 5 in the stacks 4. The thermocouple wires 7 are then connected to thermocouples embedded in sample brake disks (not indicated) at various heights in the stacks 4 to measure the representative temperature of the porous structure 2.

The gas flow through the hardware assembly 32 is more uniform and beneficial compared to other densification processes. Thus, higher quality parts (i.e., with a more uniform and more desirable microstructure) may be produced with lower manufacturing costs. Accordingly, a gas is supplied to the inlet ducts 14, while a vacuum is produced at the outlet ducts 16. The gas is then drawn through the preheater 18, thereby raising the temperature of the gas. Next, the gas exits the preheater 18 through the discharge openings 20 in the floor plate 22, thereby passing into the axial hole 28 of each of the distributors 24 if the embodiment with the distributors 24 is used. In one embodiment, the gas is then separated into a first portion of about 75% to 80% of the gas and a second portion of about 20% to 25% of the gas. The first portion passes through the inlet opening 53 in the hardware assembly base plate 46. The second portion passes out through the radial holes 30.

The first portion of gas passes up through the center opening region 5 in the stacks 4 of annular porous structures 2. The gas passes to adjacent stacks 4 in the adjacent units 38 through the transfer openings 54 in the support plates 50 and the upper base plate 48. The gas also passes out from the center opening region 5 through the open passages 8 between the adjacent porous structures 2. A controlled pressure is maintained in the center opening region 5 by the caps 56 which block and restrict the gas from completely flowing out from the center opening 5 in the top porous structure 9 of the hardware assembly 32. However, some gas flow is permitted through the center opening 5 of the top porous structure 9 to avoid stagnation of the gas near the top of the stacks 4. Accordingly, some gas flows out through the longitudinal holes in each of the caps 56, and some gas flows out the open passage 8 between the top porous structure 9 and the top support plate 52.

As shown in FIGS. 1 and 2, the second portion of gas exits the radial holes 30 in the distributor 24 and passes to the open space 23 between the floor plate 22 and the hardware assembly base plate 46. The gas then passes up into the hardware assembly 32 through passage holes 62 in the center plate 66 and the outer plates 68 of the bottom base plate 46. The gas also passes up through the gaps 74 between the center plate 66 and the outer plates 68 and between each of the outer plates 68. Thus, the gas passes up along the outer region 11 around the outer surfaces of the stacks 4. The gas passes through the units 38 by passing through passage holes 62 and gaps 74 in the support plates 50 and the upper base plate 48. As the second portion of gas passes up through the hardware assembly 32, it combines with the first portion of gas from the center opening region 5 as the gas passes out through the open passages 8. When the gas reaches the top of the hardware assembly 32, the gas passes out of the hardware assembly through passage holes 62 and gaps 74 in the top support plate 52. Both portions of gas then exit the furnace 10 through the outlet ducts 16. Thus, it is apparent that the hardware assembly 32 and distributor 24 minimize gas stagnation zones. Therefore, the related problems typically associated with gas stagnation zones are mitigated, such as soot and tar accumulations, seal-coating, nonuniform carbon deposition and undesirable microstructures.

Figure 3:
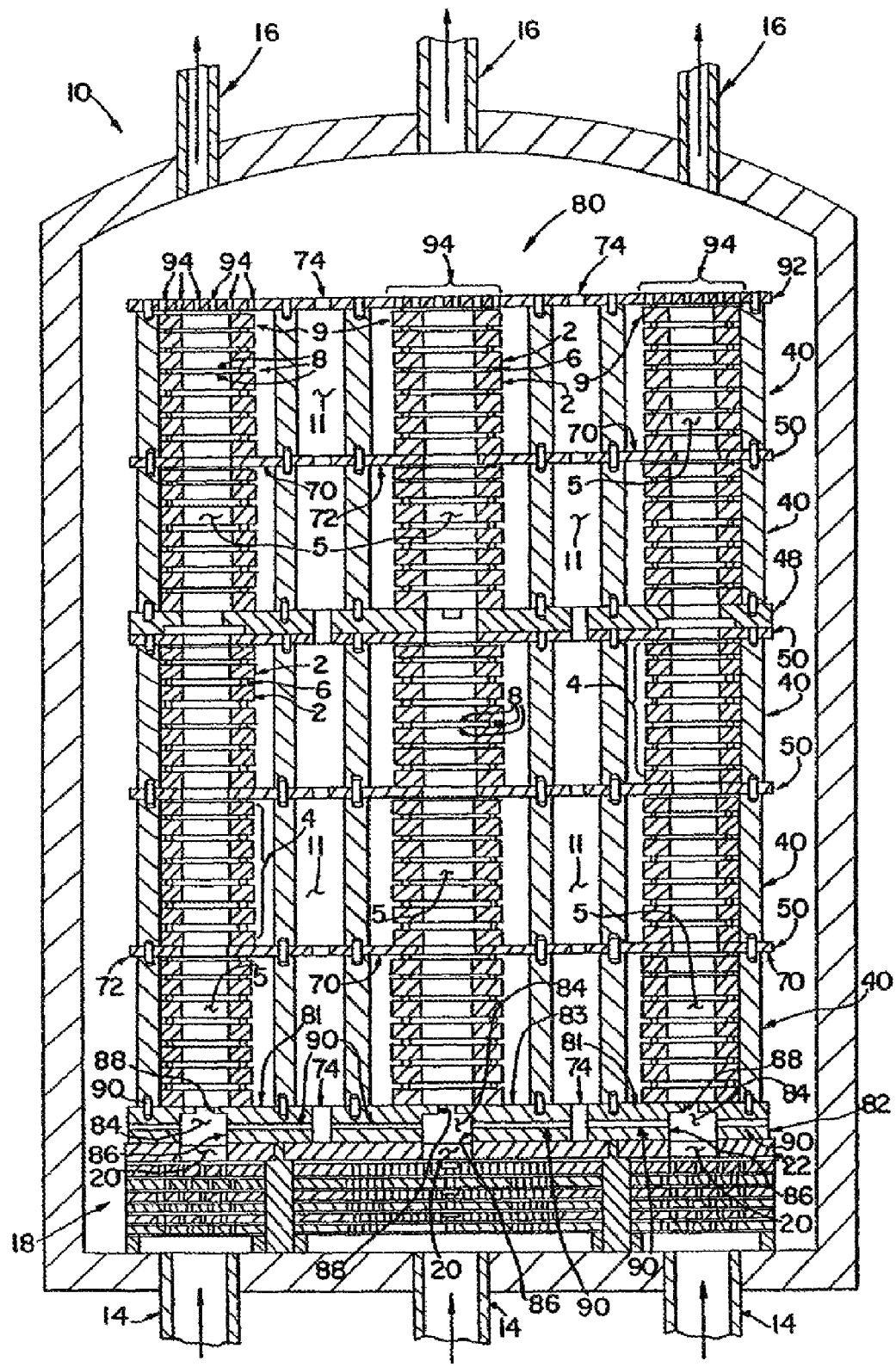
FIG. 3 shows a side cross sectional view of a furnace showing an alternate hardware assembly.

As shown in FIG. 3, the flow of gas through the hardware assembly 80 may also be controlled between a first portion and a second portion without using the distributors 24 and caps 56. In this alternative arrangement, the bottom base plate 82 rests directly on top of the furnace floor plate 22. The inlet openings 84 include a lower, larger diameter hole 86. The radial holes 90 extend through the base plate 82 from the lower, larger diameter holes 86 to the gaps 74 between the outer base plates 81, and between the outer base plates 81 and the center base plate 83, and to the outer edge of the outer base plates 81. Small holes 94 are also provided through the top support plate 92.

The gas flow through the alternative hardware assembly 80 is now apparent. Like the hardware assembly 32 previously described, the hot reactant gas enters through the inlet ducts 14 and passes through the preheater 18. The gas then exits the preheater 18 through the discharge openings 20 and passes directly into the lower, larger diameter hole 86 of the inlet opening 84. Next, a first portion of gas passes through the upper, smaller diameter hole 88 in the inlet opening 84. A second portion of gas also passes through the radial holes 90. Accordingly, as previously described with respect to the first hardware assembly 32, the first portion of gas then passes up through the center opening region 5, while the second portion of gas passes up along the outer region 11. As the first portion of gas passes up through the center opening region 5, most of the first portion passes out to the outer region 11 through the open passages 8 between adjacent brake disks 2 and commingles with the second portion. Some of the first portion, however, passes up through the entire center opening region 5 and exits the hardware assembly 80 through the small holes 94 in the top support plate 92. The remaining commingled gas then exits the hardware assembly 80 through the gaps 74 between the plates 70, 72 and along the outside of the hardware assembly 80.

Figure 4:
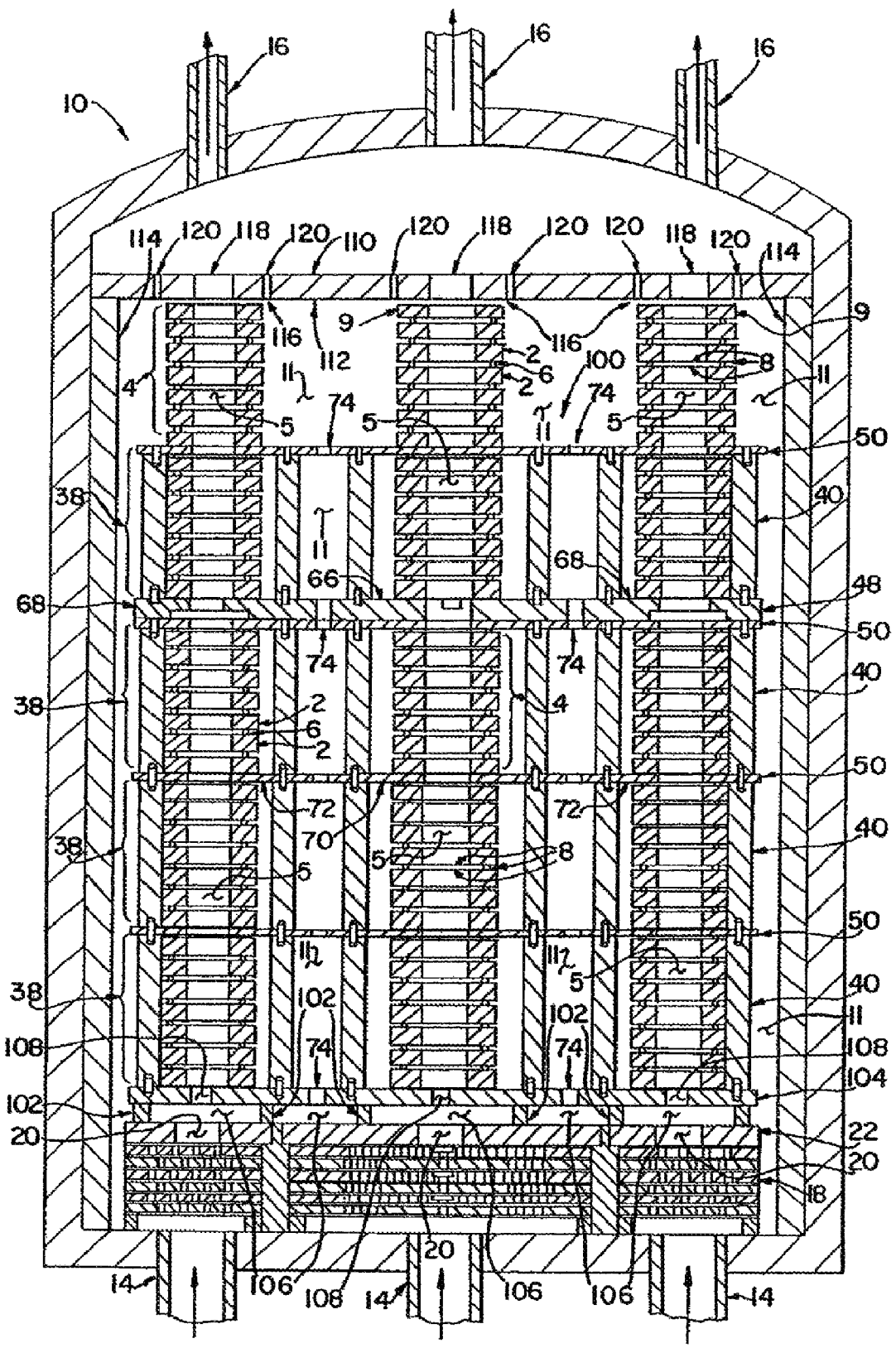
FIG. 4 shows a side cross sectional view of a furnace showing yet another alternate hardware assembly.

Turning now to FIG. 4, another alternative hardware assembly 100 is shown for flowing most of the gas from the outer region 11 to the center opening region 5. In this hardware assembly 100, spacers 102 are provided between the floor plate 22 and the bottom base plate 104. The spacers 102 may be round or square members and do not restrict gas flow through the space 106 between the floor plate 22 and the bottom base plate 104. The inlet openings 108 in the bottom base plate 104 are also smaller in size than the discharge openings 20 in the floor plate 22 to restrict flow through the inlet openings 108. The majority of the gas flows through the stack via openings 74.

If desired, the top unit 38, which is shown in the previous hardware assemblies 32, 80, may be removed in this alternative hardware assembly 100. The top stack 4 of porous structure 2 is then stacked so that the top porous structure 9 is spaced away from the bottom surface 112 of the susceptor lid 110 with an open passage 116 therebetween. Preferably, the open passage 116 is no more than 1 inch wide although larger widths may also be used. Spacer rings or other filler material (not shown), well known to those in the art, may be used to achieve a desired width for the open passage 116. Exit holes 118 are provided through the susceptor lid 110, or comparable plate, directly above each of the stacks 4. Small holes 120 through the susceptor lid 110 may also be provided away from the exit holes 118. The susceptor lid 110 is supported by and sealed to the susceptor walls 114.

The various aspects of the present invention may be used to deposit any type of CVI/CVD matrix including, but not limited to, carbon or ceramic matrix deposited within carbon or ceramic based porous structures. The invention is particularly useful for depositing a carbon matrix within a carbon-based porous structure, and especially for making carbon/carbon composite structures which can be used in aircraft brake disks. The furnace may be suited for simultaneously densifying large quantities of porous articles, for example five hundred to one thousand annular preforms for manufacturing aircraft brake disks in a single cycle.

A feature of the present invention is that the process allows for products with a desirable densified structure produced in a single non-pressure gradient CVI/CVD process cycle. The reactant gas may be introduced into the reactor volume by a variety of methods, as described below. All of these methods of introducing reactant gas info the reactor volume, and variations thereof, are intended to be encompassed within the scope of the present invention.

One of the factors in achieving the desired properties for the porous structure 2 is to monitor and change the process parameters during the single run. A variety of different processing parameters may be used to densify the porous structure 2. Furthermore, if desired, the process parameters (including temperature, pressure, and gas composition) can be decreased or adjusted during the run. Either one, two or all of these parameters can be adjusted or decreased as desired to obtain the desired density. Preferably, the values of these parameters are decreased during the run.

A vessel pressure in the range of about 5 to about 30 mm Hga ("mercury absolute") may be used. The vessel pressure may be decreased during the densification process. The initial vessel pressure may be between 10 mm Hga and 25 mm Hga. The final vessel pressure may be between 8 mm Hga and 15 mm Hga. The decrease in vessel pressure preferably occurs after about 100-300 hours on gas (the total time that the porous structures are exposed to the reactant gas composition, hereinafter abbreviated as "HOG"), or when the density of the porous structures is about 1.0 to 1.4 g/cm$^3$. The vessel pressure may be decreased by between 2 mm Hga and 8 mm Hga. Alternatively, the vessel pressure may remain constant or even increase slightly during the densification process.

A single type of gas or mixtures of multiple types of gases may be introduced into the furnace. The gas composition used for the carbon CVI/CVD process is typically composed of hydrocarbons, such as those found in natural gas, including, for example, methane, ethane, propane, and butane. Natural gas is predominantly methane but also includes ethane and propane. Additional ethane and propane may be added to the natural gas to provide the appropriate gas reactivity. The ethane and propane, as well as other gases such as butane and alkenes, will essentially entirely react to deposit a carbon matrix within the porous structures. Methane is less reactive and only a portion (generally about half) of the methane will react during the process. Thus, as used herein, the term "highly reactive gases" includes ethane, propane and other carbon precursor gases more reactive than methane. The amount of highly reactive gases in the gas composition introduced into the furnace may be between about 3% and about 20%, preferably between about 5% and about 15%. As used herein, the gas percentages are % by volume. The amount of highly reactive gas in the gas composition may be reduced as the CVI/CVD densification process proceeds. At the start of the densification process, the amount of highly reactive gases in the gas composition introduced into the furnace may be between about 10% and about 20%, preferably between about 10% and about 15%. The gas composition introduced into the furnace toward the end of the densification process preferably includes between about 3% and about 10% highly reactive gas, preferably between about 5% and about 8% highly reactive gas. In one embodiment, the gas composition initially includes between 10 and 14% highly reactive gas. The amount of highly reactive gas in decreased between 0.5% and 2% when the porous structures have a density of about 0.8 g/cm$^3$ to 1.0 g/cm$^3$. The amount of highly reactive gas is further decreased by 2% to 8% gradually over a period of time when the density of the porous structures is in the range from 0.9 g/cm$^3$ to 1.6 g/cm$^3$, so that the gas composition is about 4% to about 8% highly reactive gas when the porous structures have a density of 1.3 g/cm$^3$ to 1.6 g/cm$^3$. The amount of highly reactive gas at the end of the process may be between 3% and 8%.

Temperature in the vessel or reactor is preferably in the range of about 1830 to 1900° F., preferably in the range of about 1830 to 1875° F. Generally using the apparatus and the single cycle process of the present invention, about 500 to about 700 hours on gas are used to achieve the desired densification in the single cycle. The details of the process and apparatus of the present invention, where not described herein, are substantially similar to the non-pressure gradient CVI/CVD densifying porous structures as described in detail in U.S. Pat. No. 6,669,988, which is incorporated herein by reference.

As previously described, the temperature of the vessel, the amount of highly reactive gas in the gas composition, and the pressure of the vessel may be lowered during the run to maintain the infiltration into the porous substrate and to provide a rough laminar carbon microstructure, as desired for brake disks. A plurality of control valves and flow meters is used to control the flow of reactant gas to the furnace. The reactant gas flows though one or more preheaters, which raise the temperature of the reactant gas. A susceptor, such as susceptor 114 in FIG. 4, heats the porous structures. Reactant gas is then supplied to the inner volumes of each fixture. A small amount of reactant gas is introduced into the outer volume 11 in FIG. 1. This reactant gas may be introduced into the outer volume through channels in the base plate, through the channels in pass-through spacer designs, through other means, or through some combination of the above. Temperature sensors measure the temperatures inside the porous structure apertures and the temperatures of the porous structures.

The porous structures may be subjected to heat treatment at about 3000° F. to 4000° F., if desired. The heat treatment may occur in the middle of the non-pressure gradient CVI/CVD process or after the non-pressure gradient CVI/CVD process is completed. The heat treatment step may also be skipped. The heat treatment process is conducted at a higher temperature than the previous deposition process temperatures, and increases graphitization of the carbon matrix.

Following the non-pressure gradient CVI/CVD process, the porous structures are removed from the furnace and surface machined in order to derive an accurate bulk density measurement. The densified structures are machined into final parts. In the present invention, there is no need for multiple CVI/CVD densification steps or for intermediate machining or rearranging the structures during the CVI/CVD densification process.

In one embodiment, additional steps are taken in order to insure maximum efficiency of the process. In one embodiment, spacers are either CVI/CVD coated or graphite paint coated to prevent hard bonding of spacer surfaces to the part surfaces. The porous structures are designed with dimensions close to those of the final product, to minimize final part density gradients and machining losses. In order to ensure 100% machining clean-up on all part surfaces, special consideration is given to placement of spacers and spacer blocks on the parts' wear surfaces. Spacer blocks are small structures of similar material to the spacers and are used to help support the positioning of the porous structures. Spacers and spacer blocks are designed near optimum dimensions, enough to prevent part warping, to minimize surface coverage, and to prevent low density regions in the porous structure directly below the spacer. To minimize the adverse effect of spacer indentation into the wear faces, spacer dimensions are such that the planned ID and OD surface machining of the part would remove most of these spacer contact areas.

The various components of fixtures are preferably formed from graphite, but any suitable high temperature resistant material may be used in the practice of the invention. In one embodiment, the spacers and spacer blocks are made from a flexible, compressible graphite-like foil material known as Grafoil®. The Grafoil® material prevents the spacers and spacer blocks from CVI/CVD bonding to the part wear surfaces (and therefore causing these areas of the part to be peeled off upon spacer removal) and minimize indentation as well. The Grafoil® spacers and spacer blocks are easily separated from the parts upon load break-down, leaving the part surfaces intact. Grafoil® spacers are available from GrafTech International, Cleveland, Ohio U.S.A

EXAMPLES

For all examples, fibrous textile structures were manufactured according to FIGS. 1 through 6 of U.S. Pat. No. 4,790,052 starting with a 320K tow of unidirectional oxidized polyacrylonitrile fiber. Annular porous structures were then cut from the textile structure. The annular porous structures were pyrolyzed to transform the fibers to carbon. One or both of two types of the pyrolyzed porous structures were used in Examples 1-6. The first type, Type A, had about 27% fiber volume and a bulk density of about 0.46 g/cm$^3$. The second type, Type B, had about 20% fiber volume and a bulk density of about 0.35-0.4 g/cm$^3$. Both Type A and Type B annular porous structures were placed in a furnace similar to furnace 10 of FIG. 3.

Example 1

A single cycle densification process was conducted in a furnace for commercial aircraft-size production-type porous structures. Both Type A and Type B porous structures were used. The porous structures had thicknesses in the range of 0.9 to 1.4 inches, inner diameters in the range of 9 to 12 inches, and outer diameters in the range of 17 to 21 inches. The hours on gas were 700. The gas flow was arranged so that 80% of the gas flowed into the center of the stack and 20% of the gas by-passed to the outside of the stack via radial holes in the base plate. A stack included 55 porous structures. 0.25 inch thick Grafoil® spacers were located between each porous structure in the stack to create gaps. At the start of the run, the vessel pressure was 11.0 mm Hga and the part temperature was about 1875° F. The average gas residence time in the stack during the run was about 0.16 seconds, taking into account the 20% gas by-passed to the outside of the stack via radial holes in the base plate, and using the void volume inside the stack.

A reference time r was defined by dividing the volume of the porous structures in ft$^3$ by the gas flow in standard ft$^3$/minute. During the densification process, τ was maintained at 0.9 min. The initial gas composition was 13.5% highly reactive gas (ethane plus propane). The amount of highly reactive gas was decreased throughout the run in a gradual fashion, starting at about 150 HOG, to reach a minimum of 8% at about 375 HOG. The average part temperatures started at about 1875° F. and ended at about 1845° F. The initial vessel pressure was about 11.0 mm Hga. The vessel pressure decreased starting at about 200 HOG until a final vessel pressure of 9.5 mm Hga was reached at around 375 HOG. The process parameters (amount of highly reactive gas, temperature and pressure) were decreased stepwise during the run. The run included an intermediate carbon heat treatment at 1850° C. The densification run continued until the bulk density of the porous structures in the furnace was about 1.75 to 1.8 g/cm$^3$.

After the densification run, the densified porous structures (of both Types A and B) were tested. Archimedes testing to determine part densities and open porosity revealed desirable densification of the porous structures. Parts from the top third of the stack had a bulk density of 1.77-1.80 g/cm$^3$, 7-10% open porosity, and an impervious density of 1.93-1.97 g/cm$^3$. The deposition was primarily rough laminar.

The stack hardware design and these process parameters effectively densified parts to or near final desired density in a non-pressure gradient CVI/CVD run. The results indicated that by increasing the gas residence time, the desired density could be achieved throughout the full height of the stack of parts. The final product had similar properties to the products produced by existing multi-cycle processes.

Example 2

A single cycle densification process was conducted in a furnace for commercial aircraft-size production-type porous structures. Both Type A and Type B porous structures were used. The porous structures had thicknesses in the range of 0.9 to 1.4 inches, inner diameters in the range of 9 to 12 inches, and outer diameters in the range of 17 to 21 inches. The hours on gas were 700. The gas flow was arranged so that 80% of the gas flowed into the center of the stack and 20% of the gas by-passed to the outside of the stack via radial holes in the base plate. A stack included 55 porous structures. 0.25 inch thick Grafoil® spacers were located between each porous structure in the stack to create gaps. At the start of the run, the vessel pressure was 18 mm Hga and the part temperature was about 1860° F. The average gas residence time in the stack during the run was about 0.29 seconds, taking into account the 20% gas by-passed to the outside of the stack via radial holes in the base plate, and using the void volume inside the stack.

During the densification process, r was maintained at 0.9 min. The initial gas composition was 12% highly reactive gas (ethane plus propane). The amount of highly reactive gas was decreased throughout the run in a gradual fashion, starting at about 300 HOG, to reach a minimum of 8% at the end of the run. The average part temperatures started at about 1865° F. and ended at about 1835° F. The initial vessel pressure was about 18 mm Hga. The vessel pressure increased starting at about 300 HOG until a final vessel pressure of about 20 mm Hga was reached at around 340 HOG. The process parameters (amount of highly reactive gas, temperature and pressure) were changed stepwise during the run.

An intermediate carbon heat treatment at 1850° C. was included in this run in a separate furnace when the initial density of the parts reached a density of about 1.5 g/cm³ after about 300 hours on gas. The parts were pulled out of the initial furnace due to limitations in that furnace which prevented the running of a carbon heat treatment. The parts were placed into another furnace for the carbon heat treatment, without being otherwise disturbed or machined. Upon completion of the heat treatment, the parts were moved back to the initial furnace without being otherwise disturbed, and the process was then continued until the parts reached the density of about 1.75 to about 1.80 g/cm³.

After the run, the densified porous structures were tested. Parts from the top four-fifths of the stack had a predominantly rough laminar carbon microstructure, with an acceptable amount of smooth laminar carbon on the outer surface. The smooth laminar was removed upon completion of the final part machining. Archimedes testing before machining to determine part densities and open porosity revealed desirable densification of the porous structures. The parts had a bulk density of 1.75-1.80 g/cm³, open porosity of 3% to 8%, and an impervious density of 1.80-1.93 g/cm³. Thus, the process effectively densified parts to or near final desired density in only a non-pressure gradient CVI/CVD run.

After final machining, the Type A parts had an average density of 1.77 g/cm³ and the Type B parts had an average density of 1.76 g/cm³. Friction and wear tests were performed on these parts. Both Type A and Type B parts had similar test results to products made from existing multi-cycle CVI/CVD processes.

Example 3

A single cycle densification process was conducted in a furnace for the Type A porous structures. The porous structures had thicknesses in the range of 0.9 to 1.7 inches, inner diameters in the range of 9 to 12 inches, and outer diameters in the range of 17 to 21 inches. The hours on gas were 600. The gas flow was arranged so that 80% of the gas flowed into the center of the stack and 20% of the gas by-passed to the outside of the stack via radial holes in the base plate. A stack included about 55 porous structures. 0.25 inch thick Grafoil® spacers were located between each porous structure in the stack to create gaps. At the start of the run, the vessel pressure was 20 mm Hga and the part temperature was about 1860° F. The average gas residence time in the stack during the run was about 0.26 seconds, taking into account the 20% gas by-passed to the outside of the stack via radial holes in the base plate, and using the void volume inside the stack.

During the densification process, r was maintained at 0.9 min. The initial gas composition was 13.5% highly reactive gas (ethane plus propane). The amount of highly reactive gas was decreased throughout the run in a gradual fashion, starting at about 100 HOG, to reach a minimum of 8% at the end of the run. The average part temperatures started at about 1875° F. and ended at about 1840° F. The initial vessel pressure was about 20 mm Hga. The vessel pressure was decreased starting at about 150 HOG until a final vessel pressure of about 14 mm Hga was reached at around 450 HOG. The process parameters (amount of highly reactive gas, temperature and pressure) were changed stepwise during the run. The run included an intermediate carbon heat treatment at 1600° C. The densification run continued until the bulk density of the porous structures in the furnace was about 1.75 to 1.80 g/cm³.

For the entire stack, the parts were predominantly a rough laminar carbon microstructure with a minimal smooth laminar penetration on the external surfaces. Archimedes testing to determine part densities and open porosity revealed desirable densification of the porous structures, in the form of 1.73-1.78 g/cm³ bulk density with 5 to 10% open porosity, and an impervious density of 1.87-1.95 g/cm³. The final machined densities on parts in the upper ⅘th of the stack averaged approximately 1.75 g/cm³. The stack hardware design coupled with these process parameters, effectively densified parts to or near final density in only one uninterrupted non-pressure gradient CVI/CVD run.

Example 4

A single cycle densification process was conducted in a furnace for Type A porous structures. The furnace contained one stack, with 15 porous structures in the stack. The porous structures had thicknesses in the range of 0.6 to 1.1 inches, inner diameters in the range of 4 to 6 inches, and outer diameters in the range of 12 to 13.5 inches. The gas flow was arranged so that 85% of the gas flowed into the center of the stack and 15% of the gas by-passed to the outside of the stack via radial holes in the base plate. 0.25 inch thick spacers were located at the bottom of the stack between the first porous structure and the base plate, in order to by-pass 15% of the gas to the outside of the stack. ⅛th inch thick spacers were located between each porous structure in the stack. The average gas residence time in the stack was about 0.10 seconds, taking into account the 15% gas by-passed to the outside of the stack, and using the void volume inside the stack. The hours on gas were 750.

During the densification process, r was maintained at 0.95 min, with a gas mixture of 6.5% reactant gases in natural gas and vessel pressure of 17 mm Hga. During the run, the average part temperature was decreased from about 1900° F. to about 1840° F. An intermediate carbon heat treatment at 1850° C. was included in this run in the same furnace. The CVI/CVD process was then continued until the parts reached a density of about 1.79 g/cm³.

The parts had a rough laminar carbon microstructure with smooth laminar on the external surfaces. The smooth laminar was removed upon completion of the final part machining. The parts had a final average density of 1.79 g/cm³. Friction tests on the parts demonstrated properties comparable to conventional parts formed by a multi-cycle process. Density gradients were comparable to those of multi-cycle processed parts.

Example 5

A single cycle densification process was conducted in a furnace for the Type A porous structures. The porous structures had thicknesses in the range of 0.6 to 1.1 inches, inner diameters in the range of 4 to 6 inches, and outer diameters in the range of 12 to 13.5 inches. The hours on gas were 590. The gas flow was arranged so that 85% of the gas flowed into the center of the stack and 15% of the gas by-passed to the outside of the stack via radial holes in the base plate. 0.25 inch thick spacers were located at the bottom of the stack between the first part and the base plate to enable 15% gas by-pass to the outside of the stack. ⅛th inch thick spacers were located between each porous structure in the stack. The average gas residence time in the stack was about 0.10 seconds, taking into account the 15% gas by-passed to the outside of the stack, and using the void volume inside the stack.

During the densification process, τ was maintained at 0.67 min, with a gas mixture of 6.5% highly reactive gas (ethane plus propane), average part temperature of 1870° F., and a vessel pressure of 23 mm Hga. An intermediate carbon heat treatment at 1850° C. was included in this run in the same furnace. The CVI/CVD process was then continued until the parts reached a density of about 1.80 g/cm³.

The parts had predominately rough laminar carbon microstructure. The results from this run indicated that the higher vessel pressure of this process reduced the processing time to obtain the desired density. The final density of the parts after machining was about 1.76 g/cm³ to about 1.84 g/cm³.

Example 6

A single cycle densification process was conducted in a furnace for the Type A porous structures. The porous structures had thicknesses in the range of 0.5 to 1.2 inches, inner diameters in the range of 4 to 6 inches, and outer diameters in the range of 10 to 13.5 inches. The hours on gas were 540. The gas flow was arranged so that 80% of the gas flowed into the center of the stack and 20% of the gas by-passed to the outside of the stack via radial holes in the base plate. A stack included about 55 porous structures. 3/16 inch thick Grafoil® spacers were located between each porous structure in the stack to create gaps. The vessel pressure was maintained at 25 mm Hga during the run. The average gas residence time in the stack during the run was about 0.24 seconds, taking into account the 20% gas by-passed to the outside of the stack via radial holes in the base plate, and using the void volume inside the stack.

During the densification process, τ was maintained at 1 min. The initial gas composition was 11% highly reactive gas (ethane plus propane). The amount of highly reactive gas was decreased to about 10% at about 50 HOG (at an average part density of about 0.8 g/cm³), and was then decreased during the run in a gradual fashion to reach about 5.5% at about 200 HOG (at an average part density of about 1.4 g/cm³). The amount of highly reactive gas was further decreased to 5% at about 300 HOG (at an average part density of about 1.6 g/cm³) where it remained until the end of the run. The average part temperatures started at about 1870° F. and ended at about 1855° F. The run included an intermediate carbon heat treatment at 1850° C. at 240 HOG (at an average part density of about 1.5 g/cm³). The densification run continued until the bulk density of the porous structures was about 1.80 g/cm³. For the entire stack, the parts had predominantly a rough laminar carbon microstructure with a minimal smooth laminar penetration on the external surfaces. The final parts had a final density after machining of 1.77 g/cm³ to 1.84 g/cm³. Dynamometer tests on the parts demonstrated friction and wear properties comparable to conventional parts formed by a multi-cycle process. The thermal and mechanical properties of the parts were tested and found to be comparable to those prepared from multi-cycle processes.

The embodiments described above and shown herein are illustrative and not restrictive. The scope of the invention is indicated by the claims rather than by the foregoing description and attached drawings. The invention may be embodied in other specific forms without departing from the spirit of the invention. Accordingly, these and any other changes which come within the scope of the claims are intended to be embraced therein.

What is claimed is:

1. A process for densifying porous structures inside a furnace using nonpressure gradient CVI/CVD, the process comprising:
   providing a furnace;
   disposing a number of porous structures in a stack within the furnace, wherein the stack has a center opening region extending through the porous structures and an outer region extending along the outside of the porous structures;
   providing channels for fluid communication between the center opening region and the outer region;
   introducing a first portion of a gas composition comprising highly reactive gas to the center opening region;
   introducing a second portion of the gas composition to the outer region, wherein the first portion and the second portion are controlled proportions thereby introducing predetermined portions of the gas composition to both the center opening region and the outer region;
   densifying the porous structures from an average density of less than 0.60 g/cm³ to an average density of greater than 1.70 g/cm³ in a single cycle of nonpressure gradient CVI/CVD.

2. The process of claim 1 wherein the channels for fluid communication between the center opening region and the outer region are disposed between the porous structures.

3. The method according to claim 1, wherein the first portion is between about 15% to 85% of the gas composition and the second portion is between about 85% to 15% of the gas composition.

4. The method according to claim 1, wherein the first portion is between about 60% to 85% of the gas composition and the second portion is between about 40% to 15% of the gas composition.

5. The process of claim 1 further comprising maintaining the pressure of the gas composition at between 10 mm Hga and 25 mm Hga.

6. The process of claim 1 further comprising decreasing the pressure of the gas composition from an initial pressure of between 10 mm Hga and 25 mm Hga to a second pressure of between 8 mm Hga and 15 mm Hga.

7. The process of claim 6 wherein the gas composition is decreased from the initial pressure to the second pressure over a period of time of between 100 hours and 500 hours.

8. The process of claim 1 wherein the pressure of the gas composition is maintained at less than 25 mm Hga.

9. The process of claim 1 wherein the pressure of the gas composition is maintained at less than 15 mm Hga.

10. The process of claim 1 wherein the gas composition comprises between 5% and 20% highly reactive gas.

11. The process of claim 10 wherein the highly reactive gas is selected from the group consisting of ethane, propane, and mixtures thereof.

12. The process of claim 10 wherein the amount of highly reactive gas in the gas composition is decreased during the densification process.

13. The process of claim 12 wherein the gas composition comprises between 10% and 15% highly reactive gas at the start of the densification process and between 3% and 10% highly reactive gas at the end of the densification process.

14. The process of claim 1 wherein the single cycle comprises less than 700 hours on gas.

15. The process of claim 1 further comprising heating the porous structures to an average temperature between about 1835° F. to 1875° F.

16. A process for densifying porous structures inside a furnace using nonpressure gradient CVI/CVD, the process comprising:
providing a furnace;
disposing a number of porous structures in a stack within the furnace, wherein the stack has a center opening region extending through the porous structures and an outer region extending along the outside of the porous structures;
providing channels for fluid communication between the center opening region and the outer region;
introducing a first portion of a gas composition to the center opening region;
introducing a second portion of the gas composition to the outer region,
wherein the first portion and the second portion are controlled proportions thereby introducing predetermined portions of the gas composition to both the center opening region and the outer region, and
wherein the gas composition comprises
between 5% and 20% highly reactive gas at the start of the densification process, and the amount of highly reactive gas decreases during the densification process;
maintaining the pressure of the gas composition at between 10 mm Hga and 25 mm Hga; and
densifying the porous structures from an average density of less than 0.60 g/cm$^3$ to an average density of greater than 1.70 g/cm$^3$ in a single cycle of nonpressure gradient CVI/CVD.

17. The method according to claim 16, wherein the first portion is between about 60% to 85% of the gas composition and the second portion is between about 40% to 15% of the gas composition.

18. The process of claim 16 wherein the highly reactive gas is selected from the group consisting of ethane, propane, and mixtures thereof.

19. The process of claim 16 wherein the gas composition comprises between 10% and 15% highly reactive gas at the start of the densification process and between 3% and 10% highly reactive gas at the end of the densification process.

20. The process of claim 16 wherein the gas composition comprises between 10% and 15% highly reactive gas at the start of the densification process and between 3% and 10% when the porous structures have an average density of at least about 1.2 g/cm$^3$.

21. The process of claim 16 wherein the gas composition comprises between 10% and 14% highly reactive gas at the start of the densification process, between 8% and 12% highly reactive gas when the porous structures have an average density of at least about 0.9 g/cm$^3$, and less than 8% highly reactive gas when the porous structures have an average density of at least about 1.0 g/cm$^3$.

* * * * *